United States Patent
Zhang

(10) Patent No.: US 10,802,326 B2
(45) Date of Patent: Oct. 13, 2020

(54) TERMINAL DEVICE INCLUDING DISPLAY MODULE

(71) Applicant: WUHAN CHINA STAR OPTOELECTRONICS TECHNOLOGY CO., LTD., Wuhan, Hubei (CN)

(72) Inventor: Wei Zhang, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/463,773

(22) PCT Filed: Dec. 7, 2018

(86) PCT No.: PCT/CN2018/119927
§ 371 (c)(1),
(2) Date: May 23, 2019

(87) PCT Pub. No.: WO2020/087664
PCT Pub. Date: May 7, 2020

(65) Prior Publication Data
US 2020/0133051 A1   Apr. 30, 2020

(30) Foreign Application Priority Data

Oct. 30, 2018   (CN) .......................... 2018 1 1280971

(51) Int. Cl.
*G02F 1/1335*   (2006.01)
*H05K 7/20*   (2006.01)
(Continued)

(52) U.S. Cl.
CPC ..... *G02F 1/133512* (2013.01); *G02B 6/0055* (2013.01); *G02F 1/13338* (2013.01); *G02F 1/133308* (2013.01); *G02F 1/133385* (2013.01); *H05K 7/20963* (2013.01); *G02F 2001/133317* (2013.01); *G02F 2001/133331* (2013.01); *G02F 2202/28* (2013.01)

(58) Field of Classification Search
CPC ... G02F 1/133512; G02F 2001/133314; G02F 2001/133317; G02F 1/133308; G02F 1/13338; G02F 1/133385; G02F 2001/133331; G02F 2202/28; G02B 6/0055; H05K 7/20963
See application file for complete search history.

(56) References Cited

U.S. PATENT DOCUMENTS

2013/0063978 A1* 3/2013 Gettemy ............... G02B 6/0031
362/609
2015/0177548 A1* 6/2015 Jeon ................... G02F 1/133308
349/12

(Continued)

*Primary Examiner* — Alan B Cariaso
(74) *Attorney, Agent, or Firm* — Muncy, Geissler, Olds & Lowe, P.C.

(57) ABSTRACT

A terminal device includes a middle frame, a light-absorbing and heat-dissipating film disposed in the middle frame, and a display module. The middle frame includes a bottom and a side part connected to the bottom. The side part encircles the bottom to form a concavity on the bottom. The light-absorbing and heat-dissipating film covers the inner surfaces of the bottom and the side part. The display module is disposed in the concavity.

8 Claims, 3 Drawing Sheets

(51) Int. Cl.
*F21V 8/00* (2006.01)
*G02F 1/1333* (2006.01)

(56) References Cited

U.S. PATENT DOCUMENTS

| 2016/0027718 | A1* | 1/2016 | Park | H01L 51/5237 165/80.3 |
| 2016/0342028 | A1* | 11/2016 | Hwang | G02F 1/133611 |
| 2017/0168344 | A1* | 6/2017 | Song | G02F 1/133308 |
| 2018/0088395 | A1* | 3/2018 | Hsu | G02F 1/133308 |

* cited by examiner

TERMINAL DEVICE INCLUDING DISPLAY MODULE

FIELD OF INVENTION

The present invention relates to the field of display technologies, and in particular, to a terminal device including a display module.

BACKGROUND OF INVENTION

With development of display technologies, flat panel display devices such as liquid crystal displays (LCD) are widely applied to various consumer electronic products such as mobile phones, televisions, personal digital assistants, digital cameras, notebook computers, and desktop computers due to the advantages such as high definition, power saving, a thin body, and a wide application range, and have become mainstream in the display devices. Most LCD devices in current markets are backlight LCDs, which include an LCD panel and a backlight module. The working principle of the LCD panel is that liquid crystal molecules are placed between two parallel glass substrates, there are many vertical and horizontal thin electric wires between the two glass substrates, and the electric wires control the liquid crystal molecules to change directions by electrically energizing to refract light of the backlight module to generate images.

Generally, the LCD panel includes a color filter (CF) substrate, a thin film transistor (TFT) substrate, a liquid crystal (LC) sandwiched between the CF substrate and the TFT substrate, and a sealant. Processes forming LCD panel generally include a front-end array process (thin film, lithography, etching, and stripping), a middle-end cell process (wherein the TFT substrate is attached to the CF substrate), and a back-end module assembly process (wherein a driver IC is fixed on a printed circuit board). The front-end array process is mainly forming the TFT substrate configured to control the motion of the liquid crystal molecules. The middle-end cell process is mainly adding the LC between the TFT substrate and the CF substrate. The back-end module assembly process is mainly fixing and integrating the driver IC, which is further configured to drive the liquid crystal molecules to rotate and display images, on the printed circuit board.

Based on different sensing technologies, LCD touch panels may be classified into four types: a resistive type, a capacitive type, an optical type, and an acoustic type. Currently, a mainstream touch technology is the capacitive type. The capacitive type is further classified into a self-capacitive type and a mutual capacitive type. A capacitive touch display panel in the current markets is mainly the mutual capacitive type. The advantages of the mutual capacitive type are that the mutual capacitive type is capable of implementing multi-point touch control. Based on different structures, the touch display panel may be classified into two types: an out-cell type and an in-cell type. The out-cell type is providing a touch sensor on the surface of a CF, and providing glass covering on the touch sensor to make a touch panel module, and then fitting the touch panel module to a liquid crystal panel module. The in-cell type is providing a touch sensor in a panel structure. The touch sensor is directly disposed in a TFT of an LCD panel module. A touch function is integrated in the display panel. No out-cell touch panel is needed. Therefore, the thickness of the in-cell touch panel is thinner than that of the out-cell touch panel.

A current touch display module bonds a backlight module and a liquid crystal panel together by a hollow rectangle adhesive. After the current touch control display module is disposed in a middle frame of a mobile phone, the transmitted light may be reflected to the surface of the mobile phone via the middle frame of the mobile phone because light transmissive materials such as a sealant, a reflective sheet, and the hollow rectangle adhesive of the backlight module may transmit light of the backlight module. A user may find shiny white spots on left and right sides of a visible area when watching the mobile phone, and a black visual effect is affected.

SUMMARY OF INVENTION

The objective of the present invention is to provide a terminal device to prevent from shiny white spots appearing on two sides of a visible area and to improve a black visual effect.

To achieve the foregoing objective, the present invention provides a terminal device, including a middle frame, a light-absorbing and heat-dissipating film disposed in the middle frame, and a display module.

The middle frame includes a bottom and a side part connected to the bottom. The side part encircles the bottom to form a concavity on the bottom.

The light-absorbing and heat-dissipating film covers the inner surfaces of the bottom and the side part.

The display module is disposed in the concavity.

A color of the light-absorbing and heat-dissipating film is black.

The middle frame further includes a protrusion disposed on the side part. The protrusion encircles the side part to form an accommodating space on the side part. The accommodating space is used for accommodating a glass cover plate.

The glass cover plate includes a touch unit.

The display module includes a backlight module and a display panel disposed on the backlight module.

The backlight module includes a plastic frame, a light guide plate disposed in the plastic frame, a reflective sheet disposed on one side of the light guide plate opposite another side of the light guide plate facing the display panel, an optical film group disposed on the side of the light guide plate facing the display panel, and a double-sided adhesive disposed on the plastic frame.

A shape of the double-sided adhesive is hollow rectangle.

The display panel and the backlight module are bonded together by the double-sided adhesive.

The glass cover plate and the display module are bonded together by an optically clear adhesive (OCA).

The glass cover plate defines a visible area disposed over the display module and a shading area surrounding the visible area.

The shading area is provided with ink.

Beneficial effects of the present invention are as follows: The terminal device of the present invention includes the middle frame, the light-absorbing and heat-dissipating film disposed in the middle frame, and the display module. The middle frame includes the bottom and the side part connected to the bottom. The side part encircles the bottom to form the concavity on the bottom. The light-absorbing and heat-dissipating film covers the inner surfaces of the bottom and the side part. The display module is disposed in the concavity. When a light leaking from a side surface of the display module is emitted to the side part of the middle frame, the light-absorbing and heat-dissipating film can absorb the light leaking from the side surface of the display module. The light leaking from the side surface of the display module is prevented from being reflected from the side part of the middle frame to the top surface of the display module. White spots are prevented from appearing on two sides of the visible area of the terminal device. The black visual effect of the terminal device is improving. In addition, the light-absorbing and heat-dissipating film can further dissipate heat from the display module fast during working to reduce a temperature of the terminal device during working and prolong a service life.

BRIEF DESCRIPTION OF DRAWINGS

Please refer to the following detailed descriptions and accompanying drawings related to the present invention to further understand the features and technical content of the present invention. However, the accompanying drawings are only used for reference and description, but not for limiting the present invention.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
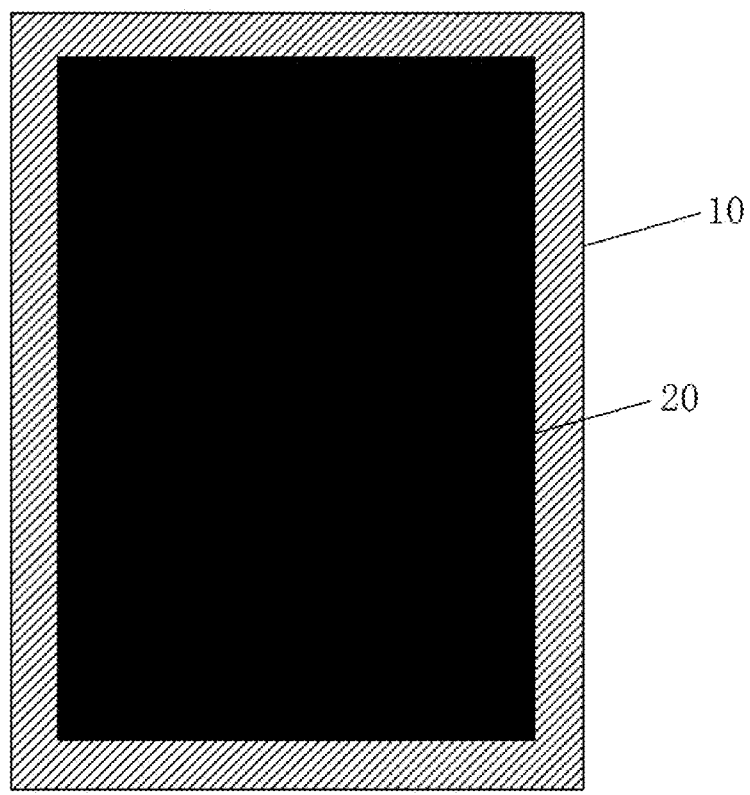
FIG. 1 is a schematic top view of a terminal device according to the present invention.
Figure 2:
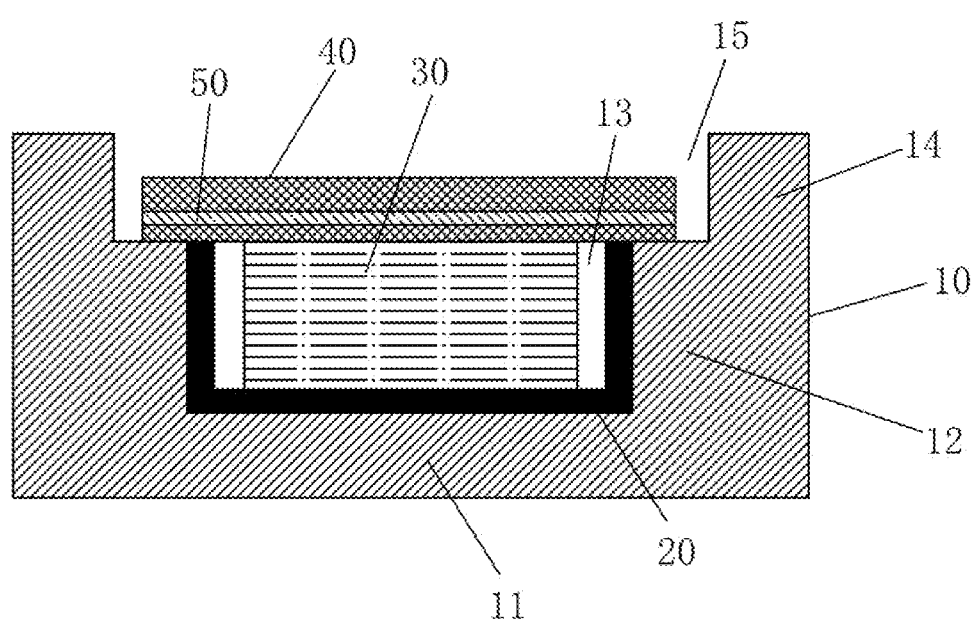
FIG. 2 is a schematic cross-sectional view of the terminal device according to the present invention.
Figure 3:
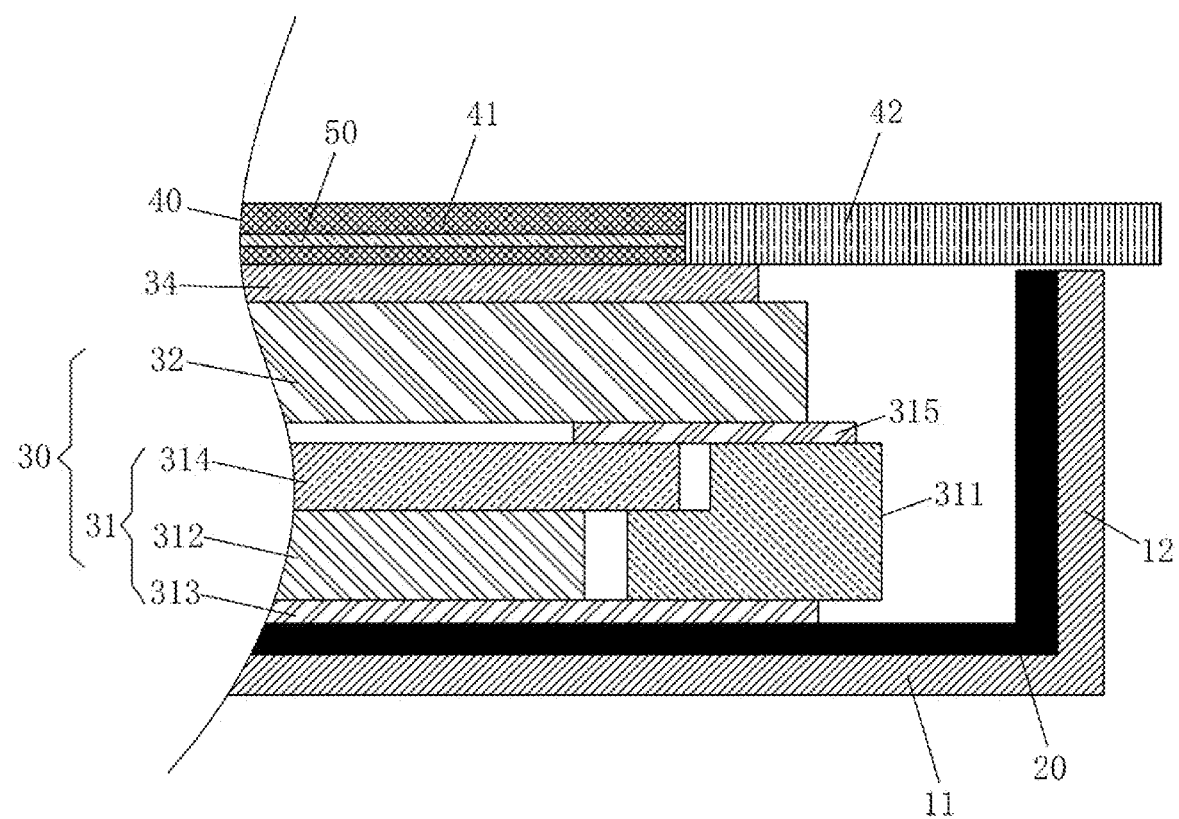
FIG. 3 is a schematic enlarged cross-sectional view of the terminal device according to the present invention.

Referring to FIG. 1 to FIG. 3, the present invention provides a terminal device including a middle frame 10, a light-absorbing and heat-dissipating film 20 disposed in the middle frame 10, and a display module 30.

The middle frame 10 includes a bottom 11 and a side part 12 connected to the bottom 11. The side part 12 encircles the bottom 11 to form a concavity 13 on the bottom 11.

The light-absorbing and heat-dissipating film 20 covers the inner surfaces of the bottom 11 and the side part 12.

The display module 30 is disposed in the concavity 13.

It should be noted that, the middle frame 10 of the present invention includes the bottom 11 and the side part 12 connected to the bottom 11. The side part 12 encircles the bottom 11 to form the concavity 13 on the bottom 11. The light-absorbing and heat-dissipating film 20 covers the inner surfaces of the bottom 11 and the side part 12 (that is, covers the entire concavity 13). The display module 30 is disposed in the concavity 13. When a light leaking from a side surface of the display module 30 is emitted to the side part 12 of the middle frame 10, the light-absorbing and heat-dissipating film 20 can absorb the light leaking from the side surface of the display module 30. The light leaking from the side surface of the display module 30 is prevented from being reflected from the side part 12 of the middle frame 10 to the top surface of the display module 30. White spots are prevented from appearing on two sides of a visible area of the terminal device. A black visual effect of the terminal device is improving. In addition, the light-absorbing and heat-dissipating film 20 can further dissipate heat from the display module 30 fast during working to reduce a temperature of the terminal device during working and prolong a service life.

In details, a color of the light-absorbing and heat-dissipating film 20 is black. Black has a better light absorbing effect.

In details, the terminal device is a mobile phone.

In details, the middle frame 10 further includes a protrusion 14 disposed on the side part 12. The protrusion 14 encircles the side part 12 to form an accommodating space 15 on the side part 12. The accommodating space 15 is used for accommodating a glass cover plate 40. The glass cover plate 40 protects the display module 30 when the terminal device is in used.

Further, the glass cover plate 40 includes a touch unit 50, such that the terminal device has a touch function.

In details, the display module 30 includes a backlight module 31 and a display panel 32 disposed on the backlight module 31.

The backlight module 31 includes a plastic frame 311, a light guide plate 312 disposed in the plastic frame 311, a reflective sheet 313 disposed on one side of the light guide plate 312 opposite another side of the light guide plate 312 facing the a display panel 32, an optical film group 314 disposed on the side of the light guide plate 312 facing the display panel 32, and a double-sided adhesive 315 disposed on the plastic frame 311.

The plastic frame 311, the reflective sheet 313, and the double-sided adhesive 315 are all light transmissive to some extent. For example, the entire brightness of the backlight module 31 is 11500 nits, the sum of the brightness of light transmitted through the plastic frame 311 and the double-sided adhesive 315 is 690 nits, and the brightness of light transmitted through the reflective sheet 313 is 120 nits. Therefore, in the present disclosure, the light-absorbing and heat-dissipating film 20 is set to absorb all light transmitted through the plastic frame 311, the reflective sheet 313, and the double-sided adhesive 315 to prevent from the transmitted light being reflected from the side part 12 of the middle frame 10 to the top surface of the display module 30.

In details, a shape of the double-sided adhesive 315 is hollow rectangle.

In details, the display panel 32 and the backlight module 31 are bonded together by the double-sided adhesive 315.

In details, the glass cover plate 40 and the display module 30 are bonded together by an optically clear adhesive (OCA) 34.

In details, the glass cover plate 40 defines a visible area 41 located over the display module 30 (that is, the visible area of the terminal device) and a shading area 42 surrounding the visible area 41. The shading area 42 is used for further avoiding the leaking light from the side surface of the display module 30. Without light-absorbing and heat-dissipating film 20, the light transmitted through the plastic frame 311, the reflective sheet 313, and the double-sided adhesive 315 is reflected by the side part 12 of the middle frame 10, and emitted from the junction between the visible area 41 and the shading area 42. Therefore, in the present disclosure, the light-absorbing and heat-dissipating film 20 and the shading area 42 operate in coordination to completely avoid light leaking from two sides of the visible area of the terminal device.

Further, the shading area 42 is provided with ink.

In conclusion, the terminal device of the present invention includes the middle frame, the light-absorbing and heat-dissipating film disposed in the middle frame, and the display module. The middle frame includes the bottom and the side part connected to the bottom. The side part encircles the bottom to form the concavity on the bottom. The light-absorbing and heat-dissipating film covers the inner surfaces of the bottom and the side part. The display module is disposed in the concavity. When the light leaking from a side surface of the display module is emitted to the side part of the middle frame, the light-absorbing and heat-dissipating film can absorb the light leaking from the side surface of the display module. The light leaking from the side surface of the display module is prevented from being reflected from the side part of the middle frame to the top surface of the display module. The white spots are prevented from appearing on the two sides of the visible area of the terminal device. The black visual effect of the terminal device is improving. In addition, the light-absorbing and heat-dissipating film can further dissipate the heat from the display module fast during working to reduce the temperature of the terminal device during working and prolong the service life.

A person of ordinary skill in the art can make various corresponding alternations and variations to the foregoing descriptions according to the technical solution and the technical idea of the present invention, and all the alternations and variations shall fall within the protection scope of the claims of the present invention.

What is claimed is:

1. A terminal device, comprising:
    a middle frame;
    a light-absorbing and heat-dissipating film disposed in the middle frame; and
    a display module, wherein
    the middle frame comprises a bottom and a side part connected to the bottom;
    the side part encircles the bottom to form a concavity on the bottom;
    the light-absorbing and heat-dissipating film covers the inner surfaces of the bottom and the side part;
    the display module is disposed in the concavity;
    the middle frame further comprises a protrusion disposed on the side part, the protrusion encircles the side part to form an accommodating space on the side, the accommodating space is used for accommodating a glass cover plate, and the protrusion covers a side surface of the glass cover plate; and
    the glass cover plate defines a visible area located over the display module and a shading area surrounding the visible area.

2. The terminal device as claimed in claim 1, wherein a color of the light-absorbing and heat-dissipating film is black.

3. The terminal device as claimed in claim 1, wherein the glass cover plate comprises a touch unit.

4. The terminal device as claimed in claim 1, wherein the display module comprises a backlight module and a display panel disposed on the backlight module, and the backlight module comprises:
    a plastic frame;
    a light guide plate disposed in the plastic frame;
    a reflective sheet disposed on one side of the light guide plate opposite another side of the light guide plate facing the display panel;
    an optical film group disposed on the side of the light guide plate facing the display panel; and
    a double-sided adhesive disposed on the plastic frame.

5. The terminal device as claimed in claim 4, wherein a shape of the double-sided adhesive is hollow rectangle.

6. The terminal device as claimed in claim 4, wherein the display panel and the backlight module are bonded together by the double-sided adhesive.

7. The terminal device as claimed in claim 1, wherein the glass cover plate and the display module are bonded together by an optically clear adhesive (OCA).

8. The terminal device as claimed in claim 1, wherein the shading area is provided with ink.

* * * * *